(12) United States Patent
Yamai

(10) Patent No.: US 10,907,993 B2
(45) Date of Patent: *Feb. 2, 2021

(54) GEAR DETECTION CIRCUIT AND WRIST WATCH

(71) Applicant: PixArt Imaging Inc., Hsin-Chu County (TW)

(72) Inventor: Masatoshi Yamai, Hsin-Chu County (TW)

(73) Assignee: PIXART IMAGING INC., Hsin-Chu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/659,614

(22) Filed: Oct. 22, 2019

(65) Prior Publication Data

US 2020/0049529 A1 Feb. 13, 2020

Related U.S. Application Data

(63) Continuation of application No. 15/805,688, filed on Nov. 7, 2017, now Pat. No. 10,527,460.

(51) Int. Cl.
*G01D 5/24* (2006.01)
*G04B 13/02* (2006.01)
(Continued)

(52) U.S. Cl.
CPC ......... *G01D 5/2405* (2013.01); *G01D 5/2412* (2013.01); *G01R 27/2605* (2013.01);
(Continued)

(58) Field of Classification Search
CPC .. G01D 5/00; G01D 5/12; G01D 5/14; G01D 5/24; G01D 5/2405; G01D 5/241;
(Continued)

(56) References Cited

U.S. PATENT DOCUMENTS 9,588,627 B2 * 3/2017 Noguchi ................. G09G 3/36
10,527,460 B2 * 1/2020 Yamai .................... G06F 3/044
(Continued)

FOREIGN PATENT DOCUMENTS

CN 1071504 A 4/1993
CN 106909063 A 6/2017

*Primary Examiner* — Hoai-An D. Nguyen
(74) *Attorney, Agent, or Firm* — WPAT, PC

(57) ABSTRACT

A gear position detection device for detecting a gear having multiple fingers is provided. The detection device includes a substrate, a control chip, and a drive line, a sense line, a first drive electrode, a second drive electrode, a first sense electrode and a second sense electrode formed on the substrate. The first and second drive electrodes are connected to the drive line to receive a drive signal. The first and second sense electrodes form induced electric field respectively with the first and second drive electrodes, and respectively output a first detected signal and a second detected signal via the sense line. The control chip outputs the drive signal via the drive line, receives the first and second detected signals via the sense line, calculate a differential signal between the first and second detected signals, and count a number of high levels of the differential signal to count a finger number.

18 Claims, 6 Drawing Sheets

(51) Int. Cl.
*G01R 27/26* (2006.01)
*G04C 3/14* (2006.01)
*G06F 3/044* (2006.01)
*G01D 5/241* (2006.01)

(52) U.S. Cl.
CPC ............... *G04B 13/02* (2013.01); *G04C 3/14* (2013.01); *G06F 3/044* (2013.01); *G01D 5/2415* (2013.01)

(58) Field of Classification Search
CPC .... G01D 5/2412; G01D 5/2415; G04B 13/00; G04B 13/02; G04C 3/00; G04C 3/14; G01R 27/00; G01R 27/02; G01R 27/26; G01R 27/2605; G06F 3/03; G06F 3/044; G06F 3/047
USPC .... 324/600, 649, 658, 679, 686; 702/47, 52; 345/157, 173, 174; 361/162
See application file for complete search history.

(56) References Cited

U.S. PATENT DOCUMENTS

| | | | |
|---|---|---|---|
| 2007/0008829 A1* | 1/2007 | Kitahara | H02N 2/004 368/255 |
| 2009/0040880 A1* | 2/2009 | Ruchonnet | G04B 19/02 368/233 |
| 2009/0067295 A1* | 3/2009 | Gil | G04B 19/02 368/69 |
| 2009/0273573 A1* | 11/2009 | Hotelling | G06F 3/044 345/173 |
| 2010/0147600 A1* | 6/2010 | Orsley | G06F 3/03547 178/18.03 |
| 2011/0160548 A1* | 6/2011 | Forster | A61B 5/053 600/301 |
| 2011/0179866 A1* | 7/2011 | Zhang | G01C 19/5755 73/504.08 |
| 2011/0271759 A1* | 11/2011 | Sakai | G01C 19/5747 73/504.12 |
| 2014/0070797 A1* | 3/2014 | Carley | G01D 5/2415 324/207.13 |
| 2014/0313155 A1* | 10/2014 | Yilmaz | G06F 3/044 345/174 |
| 2018/0136271 A1* | 5/2018 | Philipson | H03K 17/962 |

\* cited by examiner

GEAR DETECTION CIRCUIT AND WRIST WATCH

RELATED APPLICATIONS

The present application is a continuation application of U.S. application Ser. No. 15/805,688, filed on Nov. 7, 2017 the disclosure of which is hereby incorporated by reference herein in its entirety.

BACKGROUND

1. Field of the Disclosure

This disclosure generally relates to gear position detection, more particularly, to a capacitive gear position detection device and a wrist watch using the same that identify a gear position and a rotating direction of a gear by detecting a number of binary one and phases of detected signals outputted by a capacitive detector.

2. Description of the Related Art

The gear used in a wrist watch generally has the requirement of high operating accuracy and a small size. To detect the gear position or rotation angle, the detection device should be small enough to be arranged inside of the wrist watch. Meanwhile, the power consumption during the detection should be as small as possible.

It is known that an optical detection device can be used to detect the gear position or rotation angle. However, the problem of using the optical detection device is that the light beam can repeatedly reflected in an interval space of the watch to cause interference. In order to achieve high detection accuracy, the interference caused by the reflected light has to be obviated but the cost can be increased accordingly. In addition, a light source and consume relatively high power when emitting light.

Generally, a user can adjust hands of a watch manually to change the time being indicated by the hands. However, in some particular applications such as the satellite watch or GPS watch whose hour and minute hands can be automatically calibrated, e.g., at a specific time of a day, to maintain a correct time according to a standard time from outside. Accordingly, the user does not need to adjust time by him/herself. However, due to some specific reasons, such as the watch being damaged or a defective item, that cause gears in the wrist watch to have an offset, an automatically calibrated time can have a time shift from the standard time. Although the user can manually correct the deviated time to the correct time, the wrist watch still automatically calibrates itself to the deviated time such that the user has to correct the deviated time manually each time after the automatic calibration is performed.

Accordingly, the present disclosure provides a capacitive gear position detection device that has the advantages of small size and low power consumption as well as capable of detecting the deviated finger number and help to recover to the correct time correspondingly.

SUMMARY

The present disclosure provides a capacitive gear position detection device that is arranged only at a single side of a gear to occupy a smaller space.

The present disclosure further provides a capacitive gear position detection device and a wrist watch that have an index position to confirm a rotation angle of a gear.

The present disclosure further provides a capacitive gear position detection device and a wrist watch that have multiple sets of capacitive sensors to confirm a rotation direction of gear and increase the identification resolution.

The present disclosure further provides an operating method of a wrist watch that confirms the correctness of an automatic calibrated time, and the automatic calibrated time is re-adjusted to a correct time when the automatic calibrated time is detected not being correct.

The present disclosure provides a wrist watch including a substrate, a gear, and a first drive electrode, a second drive electrode, a first sense electrode and a second sense electrode formed on the substrate. The gear has a plurality of fingers and is rotatable with respect to the substrate. The first sense electrode is arranged adjacent to the first drive electrode, and the second sense electrode is arranged adjacent to the second drive electrode. The first drive electrode and the first sense electrode form a first electrode set, the second drive electrode and the second sense electrode form a second electrode set, and the first electrode set and the second electrode set are arranged in an arrangement that when one of the first and second electrode sets are rotated to totally face one of the plurality of fingers, the other one of the first and second electrode sets is between two fingers of the plurality of fingers.

The present disclosure further provides a detection circuit configured to detect rotation of a gear having a plurality of fingers. The detection circuit includes a substrate, a control chip, and multiple drive lines, multiple sense lines, a first drive electrode, a second drive electrode, a first sense electrode and a second sense electrode formed on the substrate. The substrate is configured to be arranged opposite to the gear. The first drive electrode and the second drive electrode are respectively connected to one of the multiple drive lines. The first sense electrode and the second sense electrode are respectively connected to one of the multiple sense lines, wherein the first sense electrode is arranged adjacent to the first drive electrode, and the second sense electrode is arranged adjacent to the second drive electrode. The control chip is connected to the first and second drive electrodes via the one of the multiple drive lines, and connected to the first and second sense electrodes via the one of the multiple sense lines.

The gear position detection device of the present disclosure is arranged corresponding to any one gear of multiple gears in a wrist watch, and the positions of other gears engaged with the detected gear are obtainable as well.

In the gear position detection device of the present disclosure, the shape and size of the detecting electrode set are arranged corresponding to the shape and size of the detected gear. Preferably, a size of each detecting electrode set is smaller than the size of fingers and a space between adjacent fingers to effectively use the fingers to shield the capacitive induction so as to generate distinguishable detected signals.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

Figure 1:
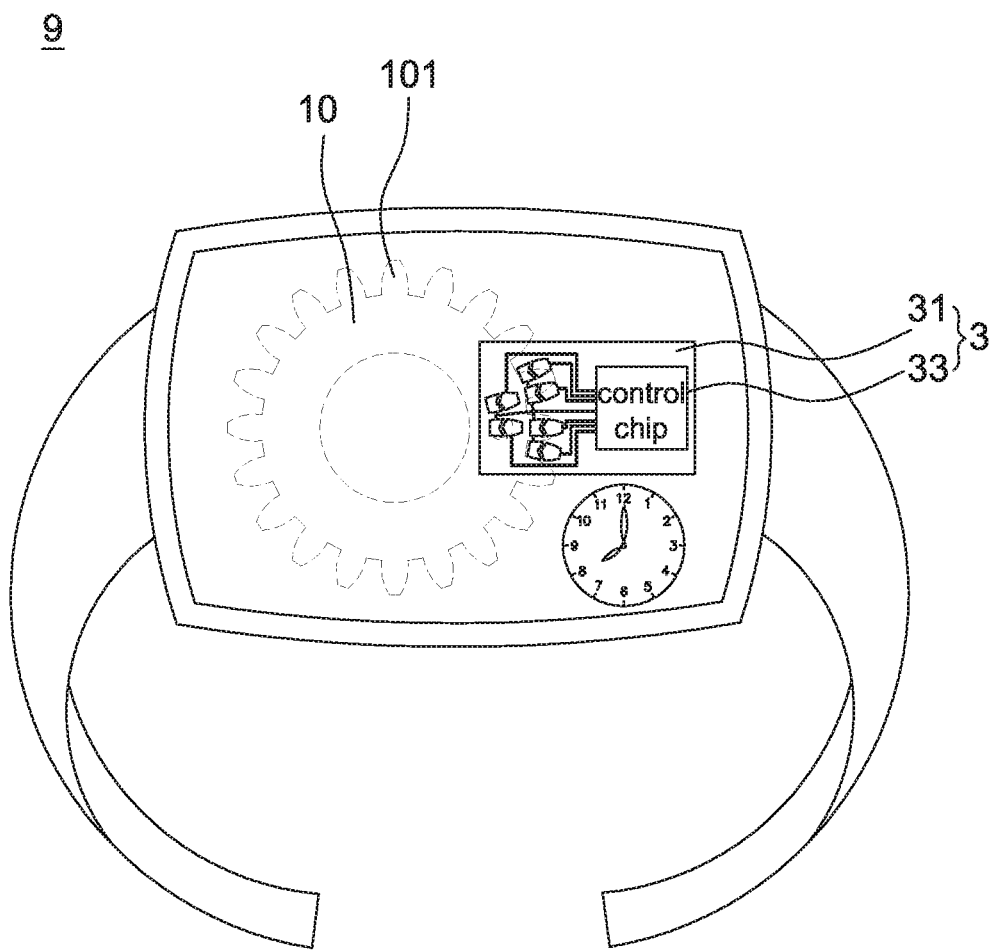
FIG. 1 is a schematic diagram of a wrist watch according to one embodiment of the present disclosure.

Referring to FIG. 1, it is a schematic diagram of a wrist watch 9 according to one embodiment of the present disclosure. The wrist watch 9 includes a gear 10 and a gear position detection device 3. The gear 10 includes a plurality of fingers 101 separately formed at an edge of the gear 10. It is appreciated that a number, a shape and a size of the plurality of fingers 101 shown in FIG. 1 are not to limit the present disclosure. It should be mentioned that although FIG. 1 shows that the gear 10 has an axle hole at the center, it is not to limit the present disclosure. In other embodiments, the gear 10 does not have any axle hole. In the present disclosure, the gear 10 is preferably made of metal.

The gear position detection device 3 includes a substrate 31, a control chip 33 and a detection circuit (including traces and electrodes) formed on the substrate. It is appreciated that although FIG. 1 shows a single gear 10, the gear 10 is one of multiple gears in the wrist watch 9. More specifically, the gear position detection device 3 of the present disclosure is arranged opposite to single side of one (generally selecting the one which is easier to be detected) of multiple gears in the wrist watch 9 to effectively reduce the occupied space. As the multiple gears engage with each other, if the correct position (or rotation angle) of the detected single gear is confirmed, positions (or rotation angles) of other multiple gears are ensured at the same time.

Figure 2:
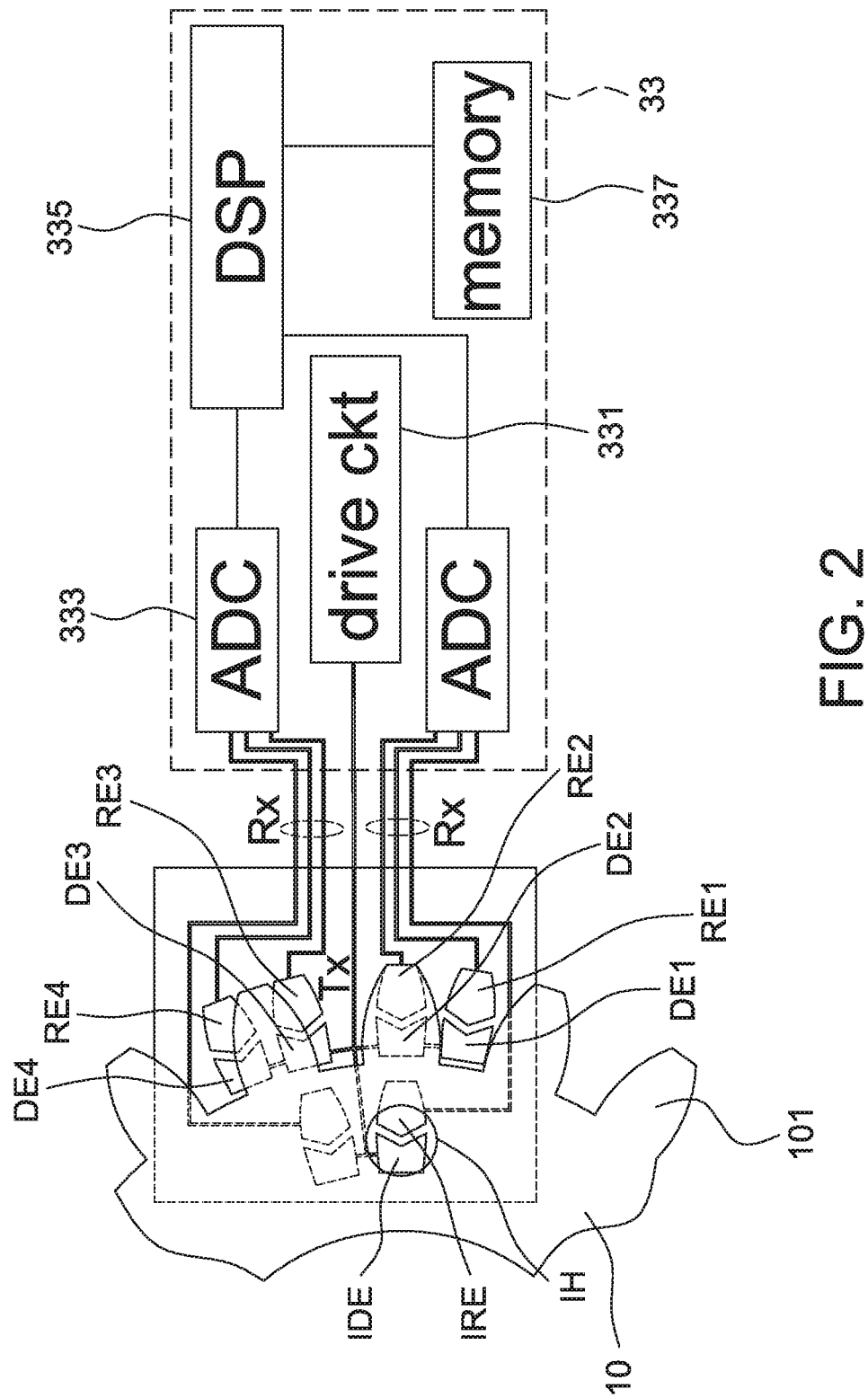
FIG. 2 is a block diagram of a gear position detection device according to one embodiment of the present disclosure.

Referring to FIG. 2, it is a block diagram of a gear position detection device 3 according to one embodiment of the present disclosure. In addition to the plurality of fingers 101, the gear 10 further includes a single index through hole IH as a reference position (illustrated with an example below). It should be mentioned that although FIGS. 1 and 2 show that the index through hole IH is aligned with one of the plurality of fingers 101 along a radial direction of the gear 10, it is not to limit the present disclosure. In other embodiments, the index through hole IH is aligned with a space between two adjacent fingers of the plurality of fingers 101 along a radial direction of the gear 10.

The gear position detection device 3 includes a drive line TX and sense lines RX formed on the substrate 31, wherein the substrate 31 is a printed circuit board (PCB) or a flexible circuit board (FCB). The control chip 33 is used to output a drive signal SD via the drive line TX, and receive detected signals SR1 and SR2, referring to FIG. 4 for example, via the sense lines RX. It is appreciated that the trace layout of the drive line TX and the sense line RX shown in FIGS. 1 to 4 is only to illustrate, but not to limit the present disclosure.

The gear position detection device 3 includes a first drive electrode DE1, a second drive electrode DE2, a first sense electrode DE2, a second sense electrode RE2 formed on the substrate 31. The first drive electrode DE1 and the second drive electrode DE2 are connected to the drive line TX to receive the drive signal SD. The first sense electrode RE1 and the second sense electrode RE2 are used to respectively form induced electric field, e.g., E1 and E2 shown in FIG. 3, with the first drive electrode DE1 and the second drive electrode DE2, and respectively output a first detected signal SR1 and a second detected signal SR2 via the sense lines RX.

In the present disclosure, the first drive electrode DE1 and the first sense electrode RE1 are considered as a first electrode set, and the second drive electrode DE2 and the second sense electrode RE2 are considered as a second electrode set. The first electrode set and the second electrode set are arranged in an arrangement that when one of the two electrode sets (FIGS. 1 to 4 showing the second electrode set) totally opposites to one one of the plurality of fingers 101 (or fully sheltered by one finger), the other one of the two electrode sets (FIGS. 1 to 4 showing the first electrode set) is between two adjacent fingers of the plurality of fingers 101 (or fully exposed from the fingers). In other words, the first electrode set and the second electrode set are separated by a half finger pitch (e.g., one finger pitch being a distance between central lines of two adjacent fingers) along the circumferential direction.

Figure 3:
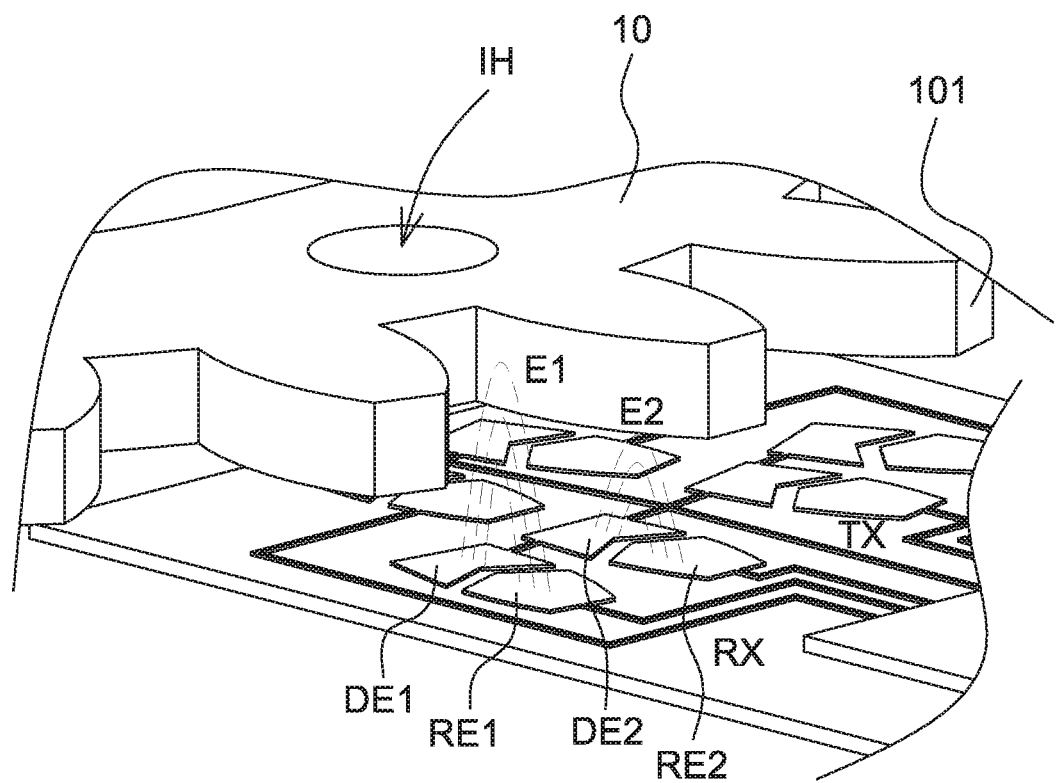
FIG. 3 is an operational schematic diagram of a gear position detection device according to one embodiment of the present disclosure.

Referring to FIG. 3, it is an operational schematic diagram of a gear position detection device 3 according to one embodiment of the present disclosure. Based on the above arrangement of the first electrode set and the second electrode set, when one of the multiple fingers 101 totally covers the second electrode set, due to the blocking effect of the finger 101, the electric field E2 between the second drive electrode DE2 and the second sense electrode RE2 is suppressed such that a value of the second detected signal SR2 has a minimum value. As shown in FIG. 3, as the first electrode set is totally not covered by any finger 101, the electric field E1 between the first drive electrode DE1 and the first sense electrode RE1 is not suppressed at all such that a value of the first detected signal SR1 has a maximum value. When one electrode set is between states of fully covered and fully exposed, an intensity of the electric field is between intensity of the electric field E1 and intensity of the electric field E2.

In some embodiments, the gear position detection device 3 further includes a third drive electrode DE3, a fourth drive electrode DE4, a third sense electrode RE3 and a fourth sense electrode RE4 formed on the substrate 31. The third drive electrode DE3 and the fourth drive electrode DE4 are connected to the drive line TX to receive the drive signal SD, wherein the drive signal SD is preferably a square wave, but is selectable from other periodic signals. The third sense electrode RE3 and the fourth sense electrode RE4 are used to form induced electric field (similar to the electric fields E1 and E2 shown in FIG. 3) respectively with the third drive electrode DE3 and the fourth drive electrode DE4, and respectively output a third detected signal and a fourth detected signal via the sense line RX.

The third drive electrode DE3 and the third sense electrode RE3 are considered as a third electrode set, and the fourth drive electrode DE4 and the fourth sense electrode RE4 are considered as a fourth electrode set. The third electrode set and the fourth electrode set are arranged in an arrangement that when the first electrode set or the second electrode set (FIGS. 1 to 4 showing the second electrode set) fully faces one of a plurality of fingers 101 (fully covered), the third electrode set and the fourth electrode set do not fully face any one of the plurality of fingers 101 and do not totally between two adjacent fingers of the plurality of fingers 101, i.e. partially covered.

Figure 4:
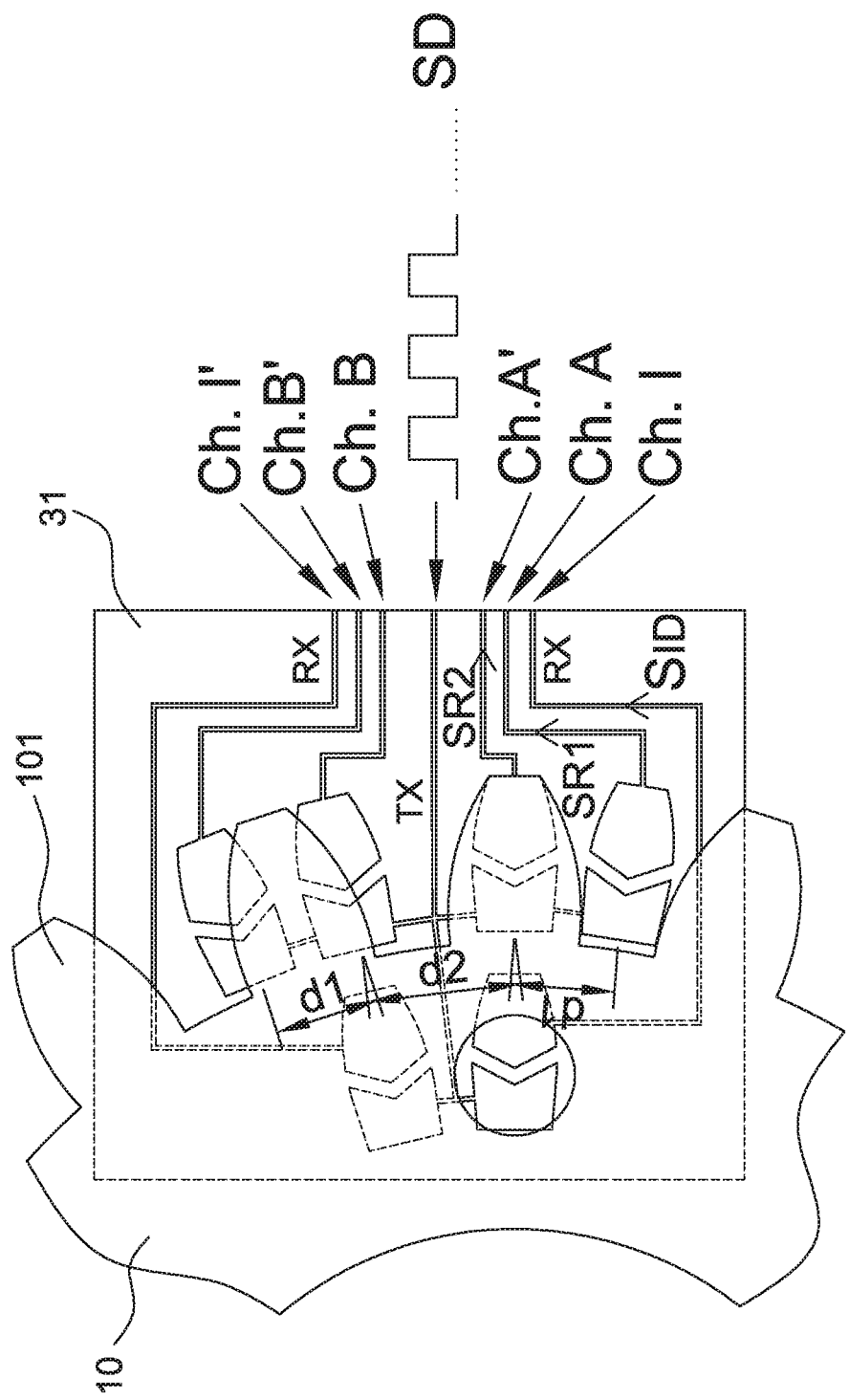
FIG. 4 is a schematic diagram of a gear position detection device according to one embodiment of the present disclosure.

Referring to FIG. 4, it is another schematic diagram of a gear position detection device 3 according to one embodiment of the present disclosure. If it is assumed that a distance d1 between the first electrode set and the second electrode set is a half finger pitch, a distance d2 between the third electrode set and the second electrode set is ¾ finger pitch, and a distance between the third electrode set and the fourth electrode set is also d1.

Figure 5:
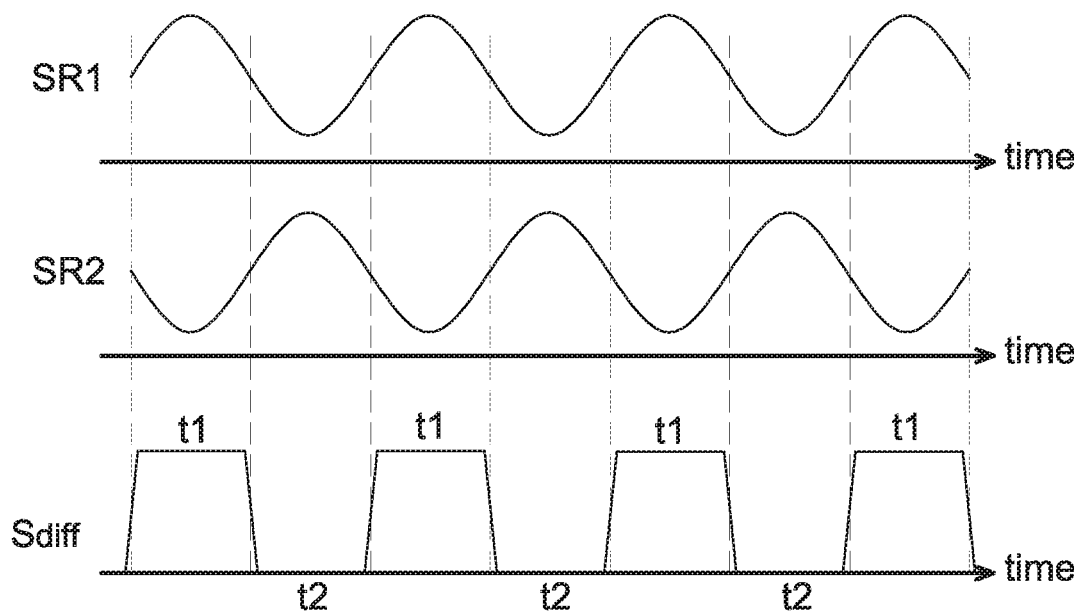
FIG. 5 is a schematic diagram of detected signals of a gear position detection device according to one embodiment of the present disclosure.

Referring to FIG. 5, it is a schematic diagram of detected signals of a gear position detection device 3 according to one embodiment of the present disclosure. Based on the above arrangement of the first electrode set, the second electrode set, the third electrode set, and the fourth electrode set, the third detected signal has the same waveform (assuming the third electrode set and the first electrode set having an identical area and shape) as the first detected signal SR1 but has a phase shift therefrom, and the fourth detected signal has the same waveform (assuming the fourth electrode set and the second electrode set having an identical area and shape) as the second detected signal SR2 but has a phase shift therefrom.

In FIG. 4, assuming that the first electrode set is a channel A, the second electrode set is a channel A', the third electrode set is a channel B, and the fourth electrode set is a channel B'. In FIG. 4-5, detected signals of the channel A and channel A' are respectively shown by SR1 and SR2 (with 180 degrees phase difference). Detected signals of the channel B and channel B' are also respectively indicated by SR1 and SR2 but with a phase shift. FIG. 4 further shows a channel I and a channel I' which are index electrode sets (described below).

In this embodiment, the channels B and B' are used to identify a rotation direction of the gear 10. However, when the gear position detection device 3 is applied to a device that does not need to detect the rotation direction of the gear 10, the channels B and B' are not implemented.

The gear position detection device 3 of the present disclosure further includes an index electrode set (e.g., channel I) that has an index drive electrode IDE, which is connected to the drive line TX and used to receive the drive signal SD, and an index sense electrode IRE, which is connected to a sense line RX and used to output an index detected signal $S_{ID}$, wherein said index detected signal $S_{ID}$ is used as a reference for triggering or stopping counting the fingers 101. In one embodiment, the index electrode set is aligned with the first electrode set or the second electrode set. As the first electrode set and the second electrode set are used to detect fingers 101 of the gear 10 and the gear 10 has a circular shape, the first electrode set and the second electrode set are arranged parallel along a circular curve corresponding to an edge of the gear 10, and the index drive electrode IDE and the index sense electrode IRE are aligned with the first electrode set or the second electrode set along a direction perpendicular to said circular curve. If the gear 10 is considered, the index drive electrode IDE and the index sense electrode IRE are aligned with the first electrode set or the second electrode set (FIGS. 1 to 4 showing being aligned with the second electrode set) along a radial direction of the gear 10 such that when the control chip 33 detects the index detected signal $S_{ID}$, one of the first electrode set and the second electrode set is just covered by one of multiple fingers 101.

In the present disclosure, the shape and size of the index electrode set do not necessary to be identical to those of the first electrode set and the second electrode set; whereas the first and second electrode sets preferably have an identical shape and size.

Referring to FIGS. 2 and 4-6, the control chip 33 includes, for example, a drive circuit 331 used to output the drive signal SD to the drive line TX, wherein the drive circuit 331 is, for example, a signal generator which is used to generate a periodic signal. The control chip 33 includes, for example, at least one analog-to-digital converter (ADC) 333 used to convert the detected signal (e.g., a first detected signal SR1 and a second detected signal SR2 shown in FIG. 5) received from the sense lines RX to digital signals. The control chip 33 further includes, for example, a digital signal processor (DSP) 335 used to receive the digital signals and calculate a differential signal $S_{diff}$ between the digitized first detected signal SR1 and the digitized second detected signal SR2 as shown in FIG. 5. In this way, the control chip 33 counts (e.g., further including a counter) a number of high levels (e.g., binary one) of the differential signal $S_{diff}$ as a method for counting a number of fingers 101 passing the first electrode set and the second electrode set in rotation.

FIG. 5 shows on example in which when a phase of the digitized first detected signal SR1 leads that of the digitized second detected signal SR2 (e.g., within time intervals t1), a binary one (i.e. high level) is obtained; whereas when a phase of the digitized first detected signal SR1 lags that of the digitized second detected signal SR2 (e.g., within time intervals t2), a binary zero (i.e. low level) is obtained.

It should be mentioned that although the above illustrations take an example of firstly digitizing the detected signals and then performing the differential operation, the present disclosure is not limited thereto. In other embodiments, the control chip 33 includes, for example, an analog differential circuit used to performing the differential operation between the first detected signal SR1 and the second detected signal SR2 at first, and then the ADC 333 converts the differential signal $S_{diff}$ to a digital signal. Therefore, the differential signal $S_{diff}$ is a digital signal or an analog signal depends on the circuit architecture of the control chip 33.

Figure 6:
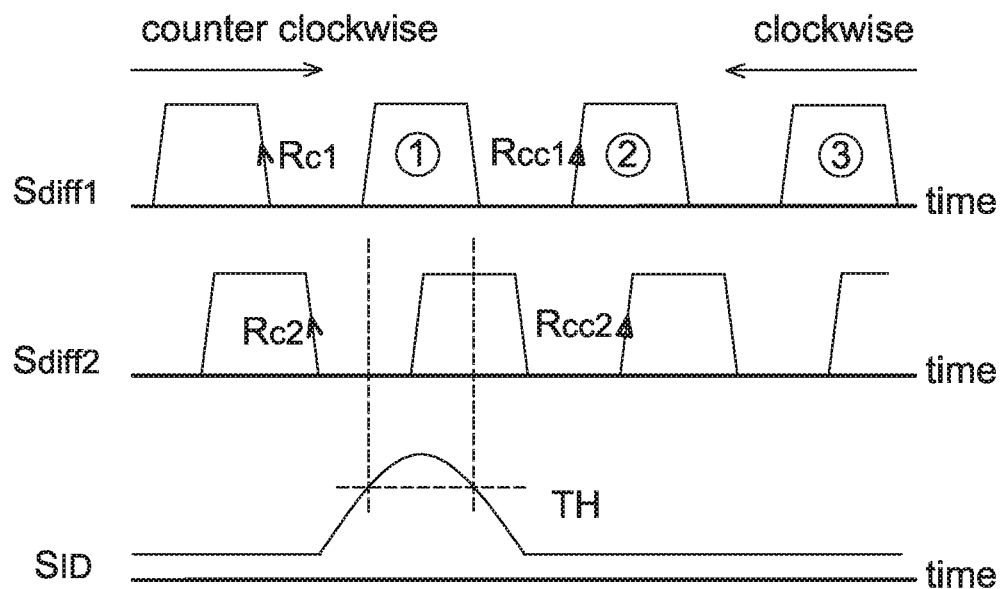
FIG. 6 is another schematic diagram of detected signals of a gear position detection device according to one embodiment of the present disclosure.

As mentioned above, in some embodiments the gear position detection device 3 further includes a third electrode set used to generate a third detected signal and a fourth electrode set used to generate a fourth detected signal. As mentioned above, the waveform of the third detected signal is substantially identical to that of the first detected signal SR1 but with a phase shift; whereas the waveform of the fourth detected signal is substantially identical to that of the second detected signal SR2 but with a phase shift. The control chip 33 also calculates a differential signal $S_{diff}$ between the third detected signal and the fourth detected signal. For illustration purposes, herein the differential signal between the first and second detected signals is referred to $S_{diff1}$, and the differential signal between the third and fourth detected signals is referred to $S_{diff2}$. As shown in FIG. 6, the second differential signal $S_{diff2}$ has a phase shift from the first differential signal $S_{diff1}$, wherein the amount of the phase shift is determined according to a distance d2 (as shown in FIG. 4) between the third electrode set and the second electrode set.

The control chip 33 further identifies a rotation direction of the gear 10 according to phases of the first differential signal $S_{diff1}$ and the second differential signal $S_{diff2}$ after the index detected signal $S_{ID}$ is detected. For example in the embodiment of FIGS. 1-4 and 6, after the index detected signal $S_{ID}$ appears and when detecting a rising edge Rcc1 of the first differential signal $S_{diff1}$ at first and then detecting a rising edge Rcc2 of the second differential signal $S_{diff2}$, the control chip 33 identifies the clockwise rotation (e.g., signals $S_{diff1}$ and $S_{diff2}$ moving from right to left in FIG. 6); on the contrary, after the index detected signal $S_{ID}$ appears and when detecting a rising edge Rc2 of the second differential signal $S_{diff2}$ at first and then detecting a rising edge Rc1 of the first differential signal $S_{diff1}$, the control chip 33 identifies the counterclockwise rotation (e.g., signals $S_{diff1}$ and $S_{diff2}$ moving from left to right in FIG. 6). In other embodiments, the control chip 33 detects falling edges of the first differential signal $S_{diff1}$ and the second differential signal $S_{diff2}$ depending on the architecture of the control chip 33.

In addition, by arranging the third electrode set and the fourth electrode set as FIGS. 1-4, the detecting resolution of the fingers 101 is improved to ½ finger pitch.

In addition, as FIGS. 1-4 show that the index drive electrode IDE and the index sense electrode IRE are aligned with the second electrode set, FIG. 6 shows that a phase of the index detected signal $S_{ID}$ corresponds to that of the first differential signal $S_{diff1}$. In other embodiments, when the index drive electrode IDE and the index sense electrode IRE are aligned with the fourth electrode set, the phase of the index detected signal $S_{ID}$ corresponds to that of the second differential signal $S_{diff2}$. In the present disclosure, when the control chip 33 receives the index detected signal $S_{ID}$, the counting of the number of the fingers 101 is started or stopped, i.e. the detected index detected signal $S_{ID}$ is used as a reference for counting.

In some embodiments, to form the index detected signal $S_{ID}$ as a square wave for the comparison, the control chip 3 further compares the index detected signal $S_{ID}$ with a threshold TH. When an amplitude of the index detected signal $S_{ID}$ is higher than the threshold TH, a high voltage level is given, and when an amplitude of the index detected signal $S_{ID}$ is lower than the threshold TH, a low voltage level is given. By appropriately selecting a value of the threshold TH, a high level interval of the index detected signal $S_{ID}$ is substantially identical to a high level interval of the differential signal $S_{diff}$. In addition, a size of the index through hole IH is properly arranged, and by selecting the threshold TH, an interval of the index detected signal $S_{ID}$ higher than the threshold TH is substantially identical to the high level interval of the differential signal $S_{diff}$.

In other embodiments, the index drive electrode IDE and the index sense electrode IRD are not exactly aligned with other electrode sets but with a shift therefrom. In this case, the differential signal in FIG. 6 (e.g., the first differential signal $S_{diff1}$) has a phase shift from the index detected signal $S_{ID}$. The control chip 33 includes, for example, a memory used to store information of this phase shift. Accordingly, when receiving the index detected signal $S_{ID}$, the control chip 33 subtracts this phase shift therefrom or adds this phase shift thereto to start to count or stop counting the number of the fingers 101.

The gear position detection device 3 of the present disclosure is further used to, for example, adjust a time deviation of a wrist watch 9, e.g., adjusting an auto calibrated time of a satellite watch or a GPS watch. Said auto calibrated time (e.g., a standard time) is not correct due to some reasons, e.g., the engagement of multiple gears being wrong.

Figure 7:
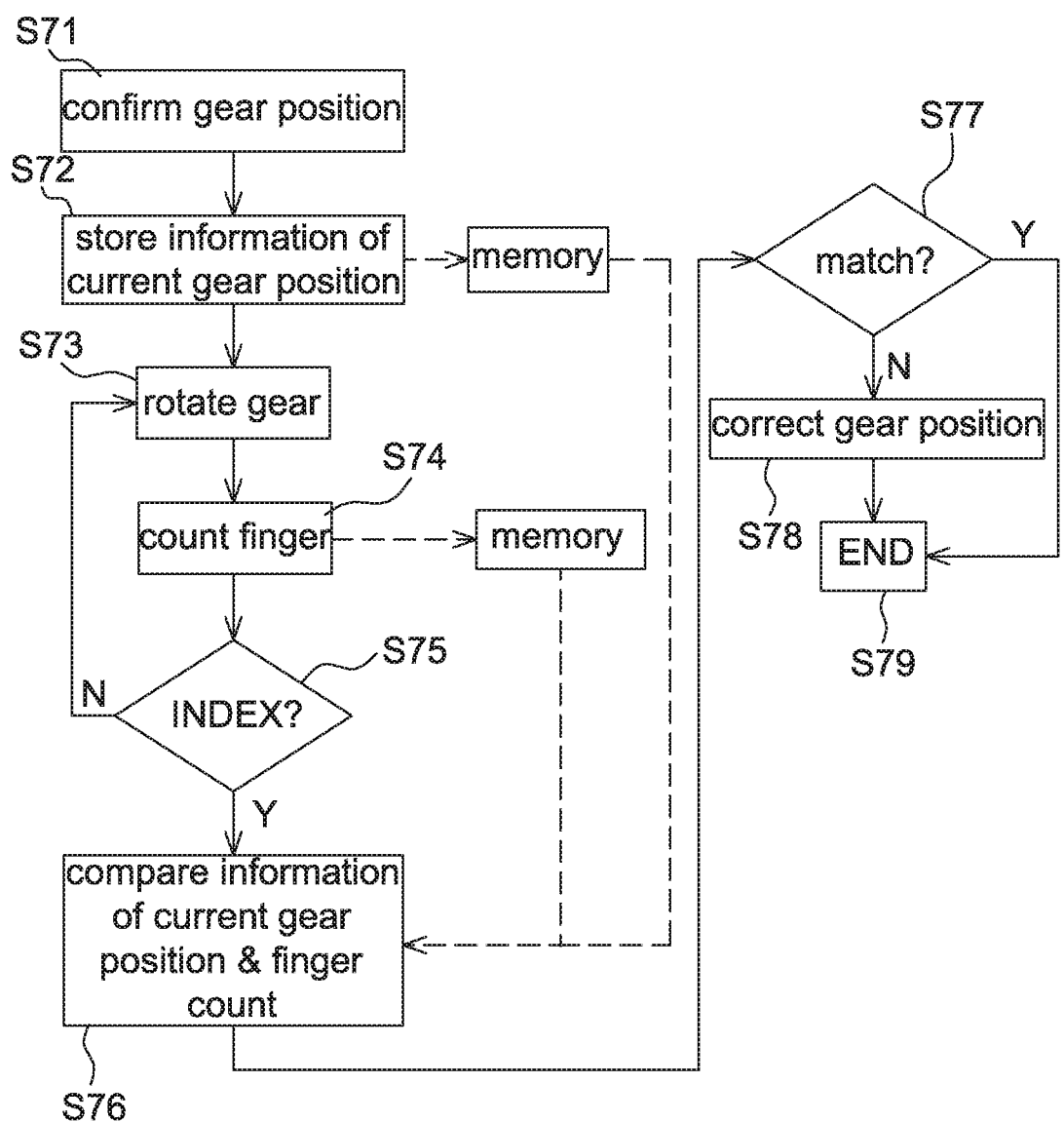
FIG. 7 is a flow chart of an operating method of a wrist watch according to one embodiment of the present disclosure.

Please referring to FIG. 7, it is a flow chart of an operating method of a wrist watch according to one embodiment of the present disclosure, which includes the steps of: confirming a gear position (Step S71); storing information of a current position of the gear (Step S72); rotating the gear (Step S73); counting a number of fingers (Step S74); identifying whether an index position is reached (Step S75); if not, continuously rotating the gear; if yes, comparing the counted number of the fingers with the information of the current position (Step S76); identifying whether the two are matched (Step S77); if not, adjusting a position of the gear (Step S78); if yes, ending the operation (Step S79).

Step S71: For example, the wrist watch 9 has an antenna for receiving a standard time signal, and the control chip 33 automatically controls the gear 10 (e.g., using a micromotor) to a current position representing the standard time, wherein the standard time signal is a satellite signal or a time zone signal associated with a GPS location. The standard time signal is considered as indicating a correct time, and the control chip 33 controls, for example using a micromotor, hands of the wrist watch 9 to said correct time.

Step S72: When the gear 10 is rotated to the current position to allow the wrist watch 9 to represent the calibrated time (e.g., the standard time), the control chip 33 stores information corresponding to the current position of the gear 10. For example, the memory 337 includes a nonvolatile memory used to store information of current positions of the gear 10 corresponding to every moment, wherein the information of the current position includes, for example, a finger number to be counted from the current position till the control chip 33 detecting the index detected signal $S_{ID}$ (i.e. to the position of the index through hole IH). In another embodiment, when said calibrated time is always the same moment of a day, the memory 337 only stores information of the current position of the gear 10 corresponding to the single moment of a day.

Step S73: Then the gear 10 rotates according to the normal operation of the wrist watch 9, and the control chip 33 does not need to rotate the gear 10 using a particular speed. That is, the normal operation herein is referred to that multiple gears (including the gear 10) rotate simultaneously to allow the wrist watch 9 to indicate time normally.

Step S74: When the gear 10 starts to rotate, the control chip 33 starts to count a number of high levels of the differential signal $S_{diff1}$, e.g., the numbers 1, 2, 3 . . . shown in FIG. 6. Each count (e.g., a square wave shown in FIG. 6) indicates that one finger 101 passes the detected electrode set, and the control chip 33 stores the counted number of the fingers 101 in the memory 337.

Step S75: When the control chip 33 detects the index detected signal $S_{ID}$, the counting is stopped and the Step S76 is entered. After the Step S76 is entered, the count number is reset to zero. If the index detected signal $S_{ID}$ is not detected, the number of the fingers 101 is counted continuously (i.e. repeating the Steps S73-S75).

Step S76: The control chip 33 then compares the counted number of the fingers 101 and the information of the current position of the gear 10 (already stored in the memory 337 in the Step S72).

Step S77: When the counted number of the fingers 101 matches the information of the current position, it means that the auto calibrated time is correct and no further adjustment is required. The Step S79 is then entered and the operation is ended.

Step S78: When the counted number of the fingers 101 does not match the information of the current position, it means that the auto calibrated time is wrong. The control chip 33 rotates the gear 10 by a difference number between the counted number of the fingers 101 and the stored finger number, e.g., using a micromotor to rotate the gear clockwise or counterclockwise by at least one finger to allow the wrist watch 9 to indicate the correct time.

More specifically, as the embodiment of the present disclosure has the index sense electrode IRE used to output the index detected signal $S_{ID}$, the index detected signal $S_{ID}$ is detected one time when the gear 10 rotates 360 degrees. Therefore, the index detected signal $S_{ID}$ is used as a reference of the gear position (or angle). When the counted gear number does not match an expected number, it is known that the gear position is wrong. In addition to detecting the wrong position, the present disclosure further adjusts the position or rotation angle of the gear 10 (by adjusting the difference number) to allow the gear position to recover to the correct position. Accordingly, the gear position detection device 3 of the present disclosure has the functions of both error detection and error cancellation.

In addition, FIG. 4 shows another index electrode set (channel I') which is used to confirm the differential signal between the third and fourth electrode sets, and the operating method and function thereof are identical to the channel I as shown in FIG. 6, and thus details thereof are not repeated herein. As the position detection function of the gear position detection device 3 is implementable by only using the channel I, the channel I' is not necessary to be implemented. If the channel I' is implemented, the second differential signal $S_{diff2}$ between channels B and B' is directly confirmed without using a phase difference between the two differential signals $S_{diff1}$ and $S_{diff2}$ after the first differential signal $S_{diff1}$ is confirmed by the channel I.

It is appreciated that the shape and size of the drive electrode and the sense electrode in FIGS. 1 to 4 are only intended to illustrate, but not to limit the present disclosure. Preferably, the electrode set is completely covered when totally facing one of a plurality of fingers 101. In addition, although FIGS. 1 to 4 show that the first electrode set and the second electrode set are arranged respectively opposite to one finger and its adjacent space between two fingers (i.e. distanced by a half finger pitch), the present disclosure is not limited thereto. For example, d1 shown in FIG. 4 is selected to be arranged as (1+½) finger pitch or longer. However, in order to reduce the size, preferably the first and second electrode sets are arranged as FIGS. 1 to 4.

It is appreciated that although the gear position detection device 3 of the present disclosure is illustrated by an example of being applied to a wrist watch 9, the present disclosure is not limited thereto. The gear position detection device and the operating method shown in FIGS. 1 to 7 are applicable to other devices having at least one gear, and the implementation thereof is identical to the above embodiment only the size and arrangement of the drive electrode and the sense electrode have to be changed corresponding to the finger size and finger pitch. One of ordinary skill in the art would understand its implementation according to the above descriptions.

In addition, in an application without the size limitation, the drive electrode and the sense electrode of the gear position detection device 3 are arranged at two sides of the gear 10, e.g., including two substrates respectively used to dispose the drive electrode and the sense electrode.

As mentioned above, the conventional optical gear position detection device has complicated manufacturing process and higher consuming power. Therefore, the present disclosure further provides a capacitive gear position detection device (as shown in FIGS. 1 to 4) and an operating method thereof (as shown in FIG. 7) that count a number of fingers by counting a number of high levels of detected signals outputted by the capacitive sensor. Furthermore, the gear position detection device includes an index position to confirm a correct rotation angle to have the effect of confirming the correctness of gear position.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. A wrist watch, comprising:
   a substrate;
   a gear comprising a plurality of fingers and rotatable with respect to the substrate;
   a first drive electrode and a second drive electrode formed on the substrate; and
   a first sense electrode and a second sense electrode formed on the substrate, wherein the first sense electrode is arranged adjacent to the first drive electrode, and the second sense electrode is arranged adjacent to the second drive electrode,
   wherein the first drive electrode and the first sense electrode form a first electrode set, the second drive electrode and the second sense electrode form a second electrode set, and the first electrode set and the second electrode set are arranged in an arrangement that when one of the first and second electrode sets are rotated to totally face one of the plurality of fingers, the other one of the first and second electrode sets is between two fingers of the plurality of fingers.

2. The wrist watch as claimed in claim 1, wherein the substrate is a printed circuit board of a flexible circuit board.

3. The wrist watch as claimed in claim 1, wherein the substrate is arranged at single side of the gear.

4. The wrist watch as claimed in claim 1, wherein the gear further has an index through hole which is aligned with, along a radial direction of the gear, one of the plurality of fingers or aligned with a space between two fingers of the plurality of fingers.

5. The wrist watch as claimed in claim 4, further comprising an index drive electrode and an index sense electrode adjacent to each other along the radial direction of the gear, wherein the index drive electrode and the index sense electrode are aligned with, along the radial direction of the gear, the first electrode set or the second electrode set.

6. The wrist watch as claimed in claim 5, further comprising a drive chip configured to drive the first and second drive electrodes, receive a first detected signal from the first sense electrode and receive a second detected signal from the second sense electrode, wherein the control chip is further configured to
   calculate a first differential signal between the first detected signal and the second detected signal, and
   count a number of high levels of the first differential signal.

7. The wrist watch as claimed in claim 6, further comprising:
   a third drive electrode and a fourth drive electrode formed on the substrate; and
   a third sense electrode and the fourth sense electrode formed on the substrate, wherein the third sense electrode is arranged adjacent to the third drive electrode and the fourth sense electrode is arranged adjacent to the fourth drive electrode, wherein the third drive electrode and the third sense electrode form a third electrode set, the fourth drive electrode and the fourth sense electrode form a fourth electrode set, and the third and fourth electrode sets are arranged in an arrangement that when one of the first and second electrode sets are rotated to totally face one of the plurality of fingers, the third and fourth electrode sets do not totally face one of the plurality of fingers and are not between a space between two fingers of the plurality of fingers.

8. The wrist watch as claimed in claim 7, wherein the control chip is further configured to drive the third and fourth drive electrodes, receive a third detected signal from the third sense electrode and receive a fourth detected signal from the fourth sense electrode, calculate a second differential signal between the third detected signal and the fourth detected signal, and identify a rotation direction of the gear according to phases of the first differential signal and the second differential signal.

9. The wrist watch as claimed in claim 6, wherein the drive chip is configured to drive the first and second drive electrodes with a square wave.

10. A detection circuit, configured to detect rotation of a gear having a plurality of fingers, the detection circuit comprising:

a substrate configured to be arranged opposite to the gear;

multiple drive lines and multiple sense lines formed on the substrate;

a first drive electrode and a second drive electrode formed on the substrate and respectively connected to one of the multiple drive lines; and a first sense electrode and a second sense electrode formed on the substrate and respectively connected to one of the multiple sense lines, wherein the first sense electrode is arranged adjacent to the first drive electrode, and the second sense electrode is arranged adjacent to the second drive electrode, and a control chip connected to the first and second drive electrodes via the one of the multiple drive lines, and connected to the first and second sense electrodes via the one of the multiple sense lines.

11. The detection circuit as claimed in claim 10, wherein the substrate is a printed circuit board of a flexible circuit board.

12. The detection circuit as claimed in claim 10, wherein the first drive electrode and the first sense electrode form a first electrode set, the second drive electrode and the second sense electrode form a second electrode set, and the detection circuit further comprises an index drive electrode and an index sense electrode which are aligned with the first electrode set or the second electrode set.

13. The detection circuit as claimed in claim 12, wherein the control chip is connected to the index drive electrode via another one of the multiple drive lines, and connected to the index sense electrode via another one of the multiple sense lines.

14. The detection circuit as claimed in claim 10, further comprising:

a third drive electrode and a fourth drive electrode formed on the substrate and connected to another one of the multiple drive lines; and a third sense electrode and the fourth sense electrode formed on the substrate and connected to another one of the multiple sense lines, wherein the third sense electrode is arranged adjacent to the third drive electrode, and the fourth sense electrode is arranged adjacent to the fourth drive electrode.

15. The detection circuit as claimed in claim 14, wherein the control chip is connected to the third and fourth drive electrodes via the another one of the multiple drive lines, and connected to the third and fourth sense electrodes via the another one of the multiple sense lines.

16. The detection circuit as claimed in claim 10, wherein the first drive electrode and the first sense electrode form a first electrode set, the second drive electrode and the second sense electrode form a second electrode set, and the first electrode set and the second electrode set are arranged adjacent to each other along a tangential direction of the gear.

17. The detection circuit as claimed in claim 16, wherein the first sense electrode is arranged adjacent to the first drive electrode along a radial direction of the gear, and the second sense electrode is arranged adjacent to the second drive electrode along another radial direction of the gear.

18. The detection circuit as claimed in claim 10, wherein the detection circuit is adapted to a watch.

* * * * *